Figure 1:
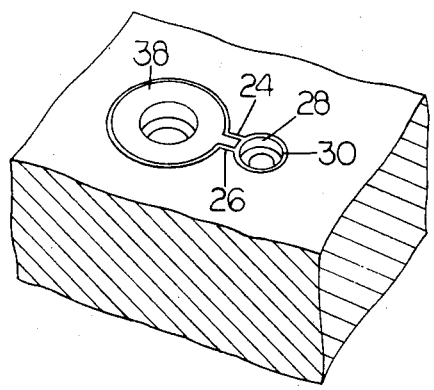

United States Patent [19]
Kern

[11] Patent Number: 4,724,180
[45] Date of Patent: Feb. 9, 1988

[54] ELECTRICALLY SHIELDED CONNECTORS
[75] Inventor: Walter P. Kern, Cohasset, Mass.
[73] Assignee: Teradyne, Inc., Boston, Mass.
[21] Appl. No.: 893,221
[22] Filed: Aug. 5, 1985
[51] Int. Cl.⁴ .......................... B32B 3/10; H05K 9/00; H05K 1/00; H01R 13/46
[52] U.S. Cl. .................................... 428/131; 428/901; 439/75; 439/608; 174/35 C
[58] Field of Search ............... 428/131, 901, 132, 136; 339/17 R, 17 M, 143 R; 174/75 C

[56] References Cited
U.S. PATENT DOCUMENTS

| | | | |
|---|---|---|---|
| 2,915,734 | 12/1959 | Alden | 174/35 C |
| 3,681,517 | 8/1972 | Meyn | 428/447 X |
| 4,389,453 | 6/1983 | Kitanaka et al. | 428/901 |

OTHER PUBLICATIONS

A. E. Peter et al., "Shielded Connectors", IBM Technical Disclosure Bulletine, vol. 22, No. 2, July 1979, pp. 523-524.
Augat Pylon Catalog 729, "Kelvin and Extended-Life Pogo Contacts", p. 5.

*Primary Examiner*—John E. Kittle
*Assistant Examiner*—Susan S. Rucker

[57] ABSTRACT

A shielding device, as for spring pins, is provided by providing a base having shielding holes, grounding holes, and a trough connecting them with an interconnected covering, providing within the shielding holes insulators with element holes therethrough.

11 Claims, 6 Drawing Figures

4,724,180

ELECTRICALLY SHIELDED CONNECTORS

FIELD OF THE INVENTION

This invention relates to electrically shielding, and more particularly, in preferred embodiments, to the coaxial shielding of spring pins.

BACKGROUND OF THE INVENTION

The desirability of shielding elements of electrical circuits, in appropriate instances, is well known. Coaxially shielded spring pins for use in connection with printed circuit boards ("PCBs") are known.

SUMMARY OF THE INVENTION

I have discovered that coaxial shielding may be provided, reliably, at low expense and consistently with high shielded element density, by providing an insulator base having shielded element and grounding element mounting holes, the inner wall of a grounding element mounting hole being in conductive electrical communication with a shield around a shielded element mounting hole and spaced therefrom by insulating material.

In preferred embodiments, the insulator base is a unitary structure molded from polyphenylene sulfide reinforced with glass and containing a multiplicity of spring pin mounting holes oriented in pairs, one spring pin mounting hole of each pair being spaced by a polytetrafluoroethylene insulating annulus from an electroless nickel shield around the annulus, the other spring pin mounting hole of each pair being conductively connected to the shield by a continuum of the electroless nickel.

In another aspect of the invention, I have discovered that such a coaxial shielding device may be provided by forming an insulating base containing a pair of holes therethrough, plating the base with metal, removing the metal from top and bottom surfaces of the base, and forming in one of the holes an annulus of insulating material. In a preferred embodiment of blind slot is provided between the two holes before plating.

PREFERRED EMBODIMENT

Following is a description of preferred embodiments of the device and method of the invention.

DRAWINGS

There is shown in:

FIG. 1 an isometric view of a broken-away portion showing one shield portion of the preferred embodiment of the device.

Figure 2:
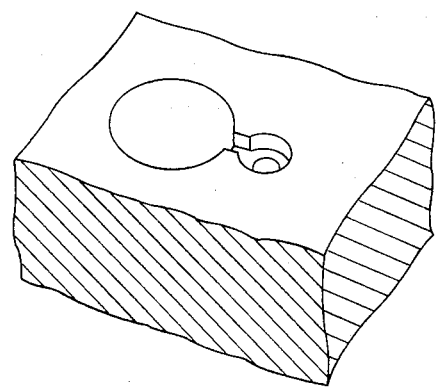

FIG. 2 a corresponding isometric view illustrating an earlier stage in the preferred embodiment of the method.

Figure 3:
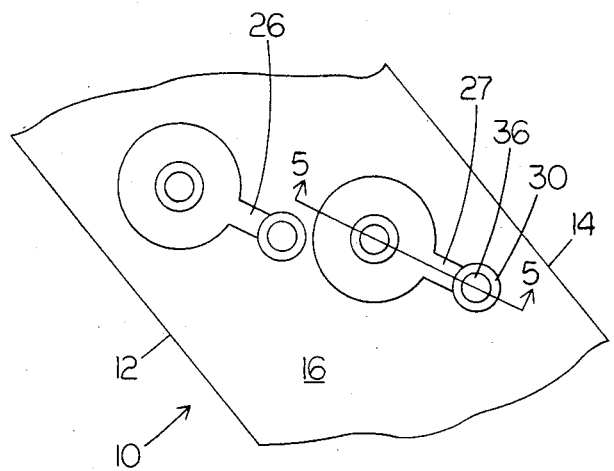

FIG. 3 a diagrammatic plan view of a broken away portion of the device.

Figure 4:
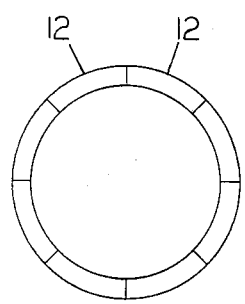

FIG. 4 a plan view on a smaller scale of an arrangement of said devices.

Figure 5:
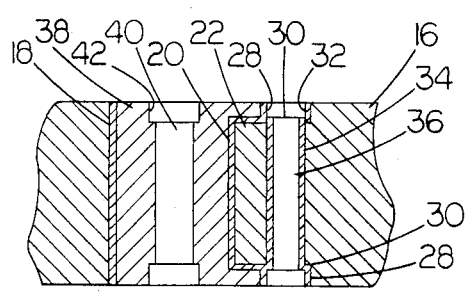

FIG. 5 a sectional view taken at 5—5 of FIG. 3.

Figure 6:
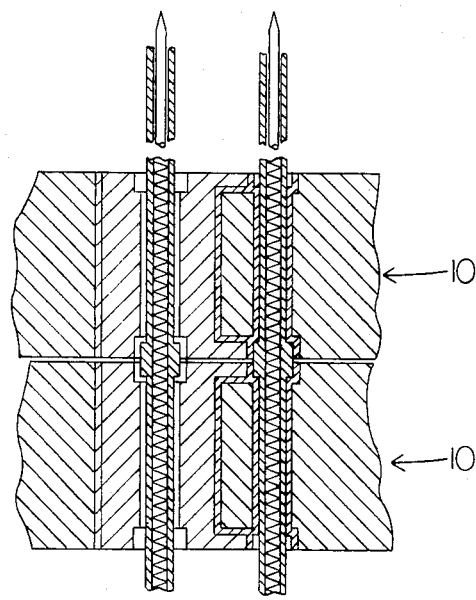

FIG. 6 a corresponding sectional view showing a second device cooperating with a first in order to secure therebetween a spring pin.

STRUCTURE

There is shown in FIG. 3 an enlarged plan view, and in FIG. 1 an isometric view, of a portion of one of the devices, indicated generally at 10, of the invention. In use, eight of these devices 10, the inner and outer walls 12 and 14 of which are coaxially arcuate (O.D. 10 inches) are abutted to form an arrangement annular in horizontal cross-section, as shown in plan view in FIG. 4.

Referring to FIGS. 2 and 5, each device 10 has a base 16 formed by injection molding of glass-filled (40%) polyphenylene sulfide (sold by Phillips Chemical Company under the trademark RTYON R-4). Extending through base 16 are cylindrically annular layers 18, 20 of dull (for better adhesion) electroless nickel. The layer extends in a continuum along the floor 22 and sides 24, 26 of blind slot 27 and therefrom in portions 28, 30 of counterbore 32 and cylindrical portion 34 within hole 36. Annular cast tetrafluoroethylene insulator 38 casting material (sold by DuPont under the trademark TEFZEL) is within electroless nickel layer 18, 20 and fills slot 27. Hole 40 with counterbores 42 is provided in insulator 38.

As shown in FIG. 6, two units 10 are brought together with spring pins indicated generally at 43 held therebetween in one set of counterbores 32, 42 for each spring pin. (Counterbores 32, 42 are provided at each end of holes 36, 40 so that the ring 44 made up of units 10 may be used with either surface up, to permit molding a single base 16 even though two configurations of base 16 are needed, for example alternating around the annulus, one being a mirror image of the other. The ring 44 may be held together and down on a PCB (not shown) by screws (not shown), and permits easily releasably connection therethrough with another PCB (not shown).

OPERATION

Current passing through spring pins 43 in insulator 38 is electrically shielded by electroless nickel completely therearound, the latter being electrically connected with the adjacent ground spring pin through a continuing layer of electroless nickel. Hole 36, in which the ground spring pin is located, thus is a shield connecting hole, in that the layer of nickel electrically connects the pin in it to the shield of the adjacent shielded pin.

METHOD

The device is made by first molding the base 16, giving it an overall thickness about 0.020 inches greater than ultimately wanted. The entire piece is then given a coating of dull electroless nickel, which extends over top, bottom and throughout the large and small hole, counterbore, and slot as shown in the uncoated piece shown in FIG. 2. About 0.010 inch thickness is then removed from top and bottom, removing with it the nickel coating thereover. Bushing 38 is then cast.

OTHER EMBODIMENTS

Other embodiments will occur to those skilled in the art.

What is claimed is:

1. An electrically shielding device which comprises:
   a base,
      said base being formed of insulating material, and
         having therein
            a shielding hole and
            a shield connecting hole,
      said shielding hole having positioned therein
         a metallic shield therearound,
         an insulator within said shield, and
         an element hole in said insulator, and said shield connecting hole having positioned therein
an electrically conductive layer,
said layer being in electrical communication with said shield.

2. The device of claim 1 in which said shield and said layer are coatings.

3. The device of claim 2 in which one continuous coating provides said coatings and said electrical communication.

4. The device of claim 3 in which said continuous coating is of plated metal.

5. The device of claim 4 in which said metal is electroless nickel.

6. The device of claim 2 in which said base and said insulator are of plastic.

7. The device of claim 6 in which said insulator is glass-loaded polyphenylene sulfide and said insulator is of castable polytetrafluoroethylene, and said metal is electroless nickel.

8. The device of claim 3 in which a trough connecting said shielding hole and said shield connecting hole is covered by said continuous coating.

9. The method of fabricating a shielding device which comprises forming an insulating base, providing therein a first hole and a second hole, coating said base over said holes with a layer of conductive material, placing in said first hole an insulating material with a third hole therethrough, and electrically interconnecting the coatings in said first and second holes.

10. The method of claim 9 in which said base is coated overall, and top and bottom surfaces are thereafter cut to electrically segregate said first and second holes.

11. The method of claim 10 in which a channel connecting said first hole and said second hole is coated therewith to provide said electrically interconnecting.

* * * * *